(12) United States Patent
Furukawa et al.

(10) Patent No.: US 9,947,469 B2
(45) Date of Patent: Apr. 17, 2018

(54) THIN-FILM DIELECTRIC AND THIN-FILM CAPACITOR ELEMENT

(71) Applicant: TDK CORPORATION, Tokyo (JP)

(72) Inventors: Masahito Furukawa, Tokyo (JP); Masanori Kosuda, Tokyo (JP); Saori Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 229 days.

(21) Appl. No.: 14/738,405

(22) Filed: Jun. 12, 2015

(65) Prior Publication Data

US 2016/0027587 A1 Jan. 28, 2016

(30) Foreign Application Priority Data

Jul. 23, 2014 (JP) .................................. 2014-149746
Jun. 8, 2015 (JP) .................................. 2015-115579

(51) Int. Cl.
*C01G 23/00* (2006.01)
*C01G 25/00* (2006.01)
(Continued)

(52) U.S. Cl.
CPC ............... *H01G 4/10* (2013.01); *C04B 35/49* (2013.01); *C04B 35/495* (2013.01); *C23C 14/0036* (2013.01); *C23C 14/08* (2013.01); *C23C 14/088* (2013.01); *C23C 14/28* (2013.01); *C23C 18/125* (2013.01); *C23C 18/1216* (2013.01); *C23C 18/1225* (2013.01); *H01G 4/1227* (2013.01); *C04B 2235/3201* (2013.01); *C04B 2235/3203* (2013.01); *C04B 2235/3208* (2013.01);
(Continued)

(58) Field of Classification Search
None
See application file for complete search history.

(56) References Cited

U.S. PATENT DOCUMENTS

2003/0047785 A1* 3/2003 Kawasaki ........... H01L 29/4908
257/350
2006/0065916 A1* 3/2006 Zhang ..................... H01L 29/93
257/295
(Continued)

FOREIGN PATENT DOCUMENTS

JP 2001-220300 A 8/2001
JP 2001-326305 A 11/2001

OTHER PUBLICATIONS

Cheng et. al. Appl. Phys. Let., 84, 26, 2004, 5431-5433.*
Beckers et. al. Mat. Sci. Eng. A253, 1998, 292-295.*

*Primary Examiner* — Vera Katz
(74) *Attorney, Agent, or Firm* — Oliff PLC

(57) ABSTRACT

A thin-film dielectric having a higher dielectric constant than usual ones and not requiring a special single crystal substrate, and a large-capacity thin-film capacitor element using the thin-film dielectric, in which a $BaTiO_3$-based perovskite solid solution and a $KNbO_3$-based perovskite solid solution are alternately formed to form a crystal structure gradient region where a lattice constant continuously changes at the interface, and thus crystal lattice strain occurs, thereby permitting the production of a thin-film dielectric having a high dielectric constant; also, a large-capacity thin-film capacitor element can be produced by using the thin-film dielectric of the present invention.

4 Claims, 1 Drawing Sheet

(51) Int. Cl.
| | |
|---|---|
| *C01G 35/00* | (2006.01) |
| *H01G 4/30* | (2006.01) |
| *H01G 4/10* | (2006.01) |
| *H01G 4/12* | (2006.01) |
| *H01G 4/33* | (2006.01) |
| *C23C 14/08* | (2006.01) |
| *C04B 35/49* | (2006.01) |
| *C04B 35/495* | (2006.01) |
| *C23C 14/00* | (2006.01) |
| *C23C 14/28* | (2006.01) |
| *C23C 18/12* | (2006.01) |

(52) U.S. Cl.
CPC .......... *C04B 2235/3213* (2013.01); *C04B 2235/3215* (2013.01); *C04B 2235/3251* (2013.01); *C04B 2235/79* (2013.01); *C23C 18/1254* (2013.01)

(56) References Cited

U.S. PATENT DOCUMENTS

2007/0148421 A1* 6/2007 Sohn ............... B32B 7/04
 428/209
2015/0249201 A1* 9/2015 Furukawa ........... H01L 41/1871
 310/366

* cited by examiner

THIN-FILM DIELECTRIC AND THIN-FILM CAPACITOR ELEMENT

BACKGROUND OF THE INVENTION

1. Field of the Invention

The present invention relates to a thin-film dielectric and a thin-film capacitor element. In particular, the present invention relates to a thin-film dielectric capable of realizing a high dielectric constant and a thin-film capacitor element using the thin-film dielectric.

2. Description of the Related Art

Increases in density and integration of electronic circuits have been recently advanced with miniaturization and performance improvement of electronic apparatuses, and there have been demands for further miniaturization and thinning of capacitor elements serving as circuit elements which play important functions in various electronic circuits.

On the other hand, clock rising time is shortened with increases in operating frequency of integrated circuits. Further, power supply voltages are further decreased for aiming at lower power consumption of apparatuses. Under these conditions, a rapid change in load of an integrated circuit easily makes the drive voltage of the integrated circuit unstable. In order to normally operate an integrated circuit, it is necessary to stabilize the drive voltage.

For this purpose, a method for stabilizing a drive voltage is used, in which a decoupling capacitor is disposed between a voltage power supply line and a ground line of an integrated circuit. In order to realize the effective function of the decoupling capacitor, it is necessary to decrease an equivalent series inductance between the integrated circuit and the decoupling capacitor and to increase the capacity of the decoupling capacitor.

In order to decrease the equivalent series inductance between the integrated circuit and the decoupling capacitor, it is effective to arrange the decoupling capacitor as near the integrated circuit as possible and attempt to decrease the inductance of wiring between the integrated circuit and the decoupling capacitor.

For this purpose, a semiconductor device is disclosed, in which an interposer is disposed between a mounting substrate and a semiconductor chip mounted on the mounting substrate, a through via electrode (through hole electrode) is provided in the interposer, and a decoupling capacitor is formed on the surface of the electrode (for example, refer to Japanese Unexamined Patent Application Publication No. 2001-326305). In the semiconductor device, silicon or glass is used as an insulator for the interposer, and a thin-film capacitor element is formed on a silicon or glass substrate by using a thin-film technique.

From the viewpoint of the degree of design freedom, a thin-film capacitor element using a thin-film dielectric has been widely used as a decoupling capacitor which satisfies the requirement described above for an integrated circuit and the like. Materials such as $SiO_2$, $Si_3N_4$, and the like have been used as materials for thin-film capacitor elements, but high dielectric constants cannot be obtained by these materials. Examples of materials having relatively high dielectric constants include perovskite-type oxides such as $(BaSr)TiO_3$, $BaTiO_3$, $SrTiO_3$, and the like. A thin-film capacitor element with high capacitance can be achieved by using a material having a high dielectric constant and by thinning a dielectric layer. However, leak currents are degraded by thinning the dielectric layer.

In order to improve leak currents by using a material with a high dielectric constant, there is proposed a thin-film capacitor element including a thin-film dielectric layer which stores charge, and a pair of electrodes formed to face each other with the thin-film dielectric layer provided therebetween. The electric layer has a perovskite structure represented by general formula $ABO_3$ (A is at least one of strontium (Sr), barium (Ba), and calcium (Ca), and B is at least one of titanium (Ti) and zirconium (Zr)), and contains 0.05 atomic % or more and less than 0.30 atomic % of at least one of vanadium (V), niobium (Nb), tantalum (Ta), antimony (Sb), bismuth (Bi), lanthanum (La), cerium (Ce), praseodymium (Pr), neodymium (Nd), gadolinium (Ga), and holmium (Ho) (refer to, for example, Japanese Unexamined Patent Application Publication No. 2001-220300). In this literature, $SrTiO_3$ containing 0.10 atomic % of Nb, $BaTiO_3$ containing 0.30 atomic % of La, $SrTiO_3$ containing 0.05 atomic % of V, and the like are described as examples of a material for the dielectric layer, and a leak current of about $10^{-8}$ $A/cm^2$ is obtained.

However, in order to further decrease the size of an apparatus, a dielectric thin film having a high dielectric constant is required. According to Japanese Unexamined Patent Application Publication No. 2001-220300, a high dielectric constant is realized by forming a superlattice structure in which a $BaTiO_3$ epitaxial film and a $SrTiO_3$ epitaxial film are alternately stacked.

In addition, although a high dielectric constant is achieved by the superlattice-structure thin-film dielectric described in Japanese Unexamined Patent Application Publication No. 2001-220300, a special single crystal substrate is required for epitaxial growth, thereby causing difficulty in industrial use.

SUMMARY OF THE INVENTION

Accordingly, it is an object of the present invention to provide a thin-film dielectric having a higher dielectric constant than usual thin-film dielectrics and not requiring a special single crystal substrate. It is another object is to provide a large-capacity thin-film capacitor element using the thin-film dielectric.

In order to achieve the objects, a thin-film dielectric of the present invention includes at least one $(Ba_{1-x}M_x)_\alpha(Ti_{1-y}N_y)O_3$ film (M is at least one of Sr and Ca, N is at least one of Zr and Hf, $0 \leq x \leq 0.4$, $0 \leq y \leq 0.6$, and $0.7 \leq \alpha \leq 1.0$) and at least one $(K_{1-w}A_w)_\beta(Nb_{1-z}Ta_z)O_3$ film (A is at least one of Na and Li, $0 \leq w \leq 0.6$, $0 \leq z \leq 0.2$, and $0.7 \leq \beta \leq 1.0$) which are alternately formed, the $(Ba_{1-x}M_x)_\alpha(Ti_{1-y}N_y)O_3$ film and the $(K_{1-w}A_w)_\beta(Nb_{1-z}Ta_z)O_3$ film being joined to each other. This structure can provide a thin-film dielectric having a higher dielectric constant than usual thin-film dielectrics and not requiring a special single crystal substrate.

Also, a large-capacity thin-film capacitor element can be achieved by applying the thin-film dielectric of the present invention to a thin-film capacitor element.

According to the thin-film dielectric of the present invention, a $BaTiO_3$-based perovskite solid solution (referred to as a "BT solid solution" hereinafter) and a $KNbO_3$-based perovskite solid solution (referred to as a "KN solid solution" hereinafter) are alternately formed to produce crystal lattice strain at the interface therebetween. In other words, by forming a crystal structure gradient region in which a lattice constant continuously changes, it is possible to achieve a thin-film dielectric having a higher dielectric constant than usual thin-film dielectrics and not requiring a special single crystal substrate. Also, a large-capacity thin-film capacitor element can be provided by using the thin-film dielectric of the present invention.

DESCRIPTION OF THE PREFERRED EMBODIMENTS

Figure 1:
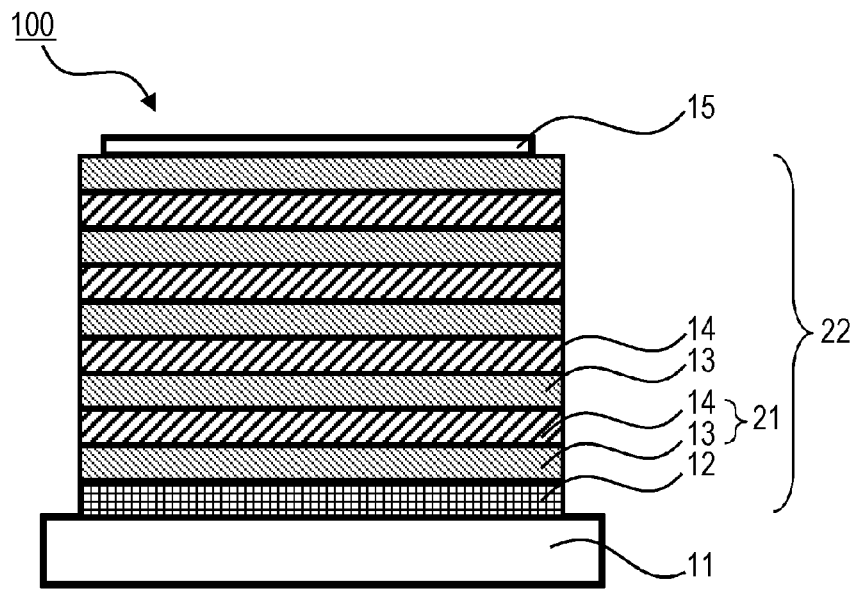
FIG. 1 is a schematic cross-sectional view of a thin-film capacitor element according to an embodiment of the present invention.

FIG. 1 is a schematic cross-sectional view of a thin-film capacitor element including a thin-film dielectric according to an embodiment of the present invention.

A thin-film capacitor element 100 includes a metal plate 11, a thin-film dielectric 22, and a metal film 15 provided to face the metal plate 11 with the thin-film dielectric 22 provided therebetween, the thin-film dielectric 22 being formed by forming a $BaTiO_3$-based perovskite solid solution polycrystalline film (hereinafter referred to as a "BT solid solution polycrystalline film") 12 on the metal plate 11 and repeatedly stacking a $KNbO_3$-based perovskite solid solution film (hereinafter referred to as a "KN solid solution film") 13 and a $BaTiO_3$-based perovskite solid solution film (hereinafter referred to as a "BT solid solution film") 14 on the BT solid solution polycrystalline film 12.

The metal plate 11 has conductivity and functions as an electrode, and is not particularly limited as long as it does not cause reaction, degradation, and deformation in a process for forming the BT solid solution polycrystalline film 12, the KN solid solution film 13, and the BT solid solution film 14. In order to form the thin-film dielectric 22, the surface of the metal plate 11 is preferably flattened by polishing. The material of the metal plate 11 may be properly selected according to a method for forming a dielectric layer. When the dielectric layer is formed by a solvothermal method described in examples of the present invention, a platinum (Pt) plate is suitable. When the dielectric layer is formed by a sputtering method, a pulsed laser deposition method (PLD), a sol-gel method, or a chemical vapor deposition (CVD) method, a Pt film provided on a silicon substrate, a $SrRuO_3$ (SRO) conductive oxide film, a copper (Cu) plate, a copper (Cu) foil, a nickel (Ni) plate, a nickel (Ni) foil, or the like can be used. The thickness of the substrate or metal used as a base is not limited.

Since it is difficult to form a perovskite structure compound so as to form a layer having a heterojunction on a metal surface by the solvothermal method, it is necessary to form the BT solid solution polycrystalline film 12 on the metal surface.

The BT solid solution polycrystalline film 12 is formed by a usual thin film forming method. For example, the film 12 can be formed by using any one of various thin film forming methods such as a vacuum vapor deposition method, a radio-frequency sputtering method, a PLD method, a metal organic chemical vapor deposition method (MOCVD) method, a metal organic decomposition method (MOD), a sol-gel method, and the like. When the film is formed by the thin film forming method described above, the film generally has a crystal grain diameter of 10 nm to 300 nm and a thickness of 50 nm to 5 μm. If the cost is not taken into consideration, a single crystal film may be formed. The BT solid solution polycrystalline film 12 is a polycrystalline film in which Ba of $BaTiO_3$ is partially substituted by Ca or Sr within a range of 0 mol % to 40 mol %, and Ti is partially substituted by Zr or Hf within a range of 0 mol % to 40 mol %.

The KN solid solution film 13 can be formed by any one of various thin film forming methods such as the solvothermal method, a radio-frequency sputtering method, and a PLD method which are described in examples of the present invention, and the above-described vacuum vapor deposition method, MOCVD method, MOD method, and sol-gel method, and the like. Also, a layer having a heterojunction is formed at the interface with the BT solid solution polycrystalline film 12, and the thickness is 10 nm to 200 nm. In addition, the KN solid solution film 13 is a film in which K of $KNbO_3$ is partially substituted by Na or Li within a range of 0 mol % to 60 mol %, and Nb is partially substituted by Ta within a range of 0 mol % to 20 mol %. Further, the K/Nb ratio of $KNbO_3$ in the film is within a range of 0.7 to 1.0.

The BT solid solution film 14 can be formed by the same method as that of the BT solid solution polycrystalline film 12. Also, the BT solid solution film 14 forms a layer having a heterojunction at the interface with the KN solid solution film 13, and has a thickness of 10 nm to 200 nm. In addition, like the BT solid solution polycrystalline film 12, the BT solid solution film 14 is a film in which Ba of $BaTiO_3$ is partially substituted by Ca or Sr within a range of 0 mol % to 40 mol %, and Ti is partially substituted by Zr or Hf within a range of 0 mol % to 60 mol %.

As described above, a composite dielectric layer 21 including the KN solid solution film 13 and the BT solid solution film 14 is formed on the BT solid solution polycrystalline film 12. The composite dielectric layer 21 is formed repeatedly several times to form the thin-film dielectric 22. As described above, the composite dielectric layer 21 is a dielectric layer in which a layer having a heterojunction is formed at the interface, and has a thickness of 20 nm to 400 nm. Also, a layer having a heterojunction is formed at each of the interfaces between the composite dielectric layers 21 adjacent to each other in the vertical direction.

When the substation amount exceeds the above-described range, a lattice constant is changed, and thus a crystal structure gradient region in which a lattice constant continuously changes as described below, that is, crystal lattice strain, is not produced, and thus significant improvement in dielectric constant is not achieved.

The term "a layer having a heterojunction" represents that different materials are joined (grown) on the same crystal plane. That is, in this embodiment, the term represents that the BT solid solution film and the KN solid solution film are grown with, for example, (100) plane orientation, and are joined together. The junction plane can be confirmed by observing an electron beam diffraction lattice image obtained with a transmission electron microscope (TEM) or the like.

Even when crystals are grown on the same crystal plane as described above, different materials have different lattice constants, and thus a crystal structure gradient region where a lattice constant continuously changes is present because of the occurrence of lattice mismatching at the interface. The crystal structure gradient region can be confirmed by analyzing the lattice image described above and by observing changes in the shape of a peak of a specified diffraction by using, for example, an X-ray diffraction (XRD) apparatus. The diffracted X-ray intensity obtained by an X-ray diffraction apparatus generally used is weak, and thus the crystal structure gradient region can be more easily confirmed by using radiated light. Further, the crystal structure gradient region can be confirmed by performing measurement at 2θ of 10 to 100° and Rietveld analysis of all data of the measurement.

The metal film 15 includes a metal functioning as an upper electrode, and a Pt film, an Ag film, a Cu film, a Ni film, or the like is generally used. However, other metals may be used as long as they have conductivity and function as an electrode. Examples of the method for forming the electrode film include physical vapor deposition methods such as a PVD method, a PLD method, and the like. Examples of the PVD method which can be used include vacuum vapor deposition methods such as a resistance-heating vapor deposition, electron-beam-heating vapor deposition, and the like; sputtering methods such as DC sputtering, radio-frequency sputtering, magnetron sputtering, ECR sputtering, ion beam sputtering, and the like; various ion plating methods such as radio-frequency ion plating, activation vapor deposition, arc ion plating, and the like; a molecular beam epitaxy method, a laser ablation method, an ionized cluster beam vapor deposition method, an ion beam vapor deposition method, and the like. The thickness of the metal film 15 is not particularly limited but is preferably about 10 nm to 1000 nm.

Although, in the embodiment described above, the BT solid solution polycrystalline film 12 is used as a polycrystalline film provided on the metal plate 11, a KN solid solution polycrystalline film may be used as a modified example in place of the BT solid solution polycrystalline film 12. In this case, a BT solid solution film is formed on the KN solid solution polycrystalline film, and the KN solid solution film is formed on the BT solid solution film.

Next, a method for making the thin-film capacitor element 100 of the embodiment is described.

First, the metal plate 11 is prepared, and the BT solid solution polycrystalline film 12 is formed on a surface of the metal plate 11 by a general thin film forming method. For example, the BT solid solution polycrystalline film 12 can be formed by any one of various thin film forming methods such as a vacuum vapor deposition method, a radio-frequency sputtering method a PLD method, a MOCVD method, a MOD method, a sol-gel method, and the like.

Next, the KN solid solution film 13 is formed on the BT solid solution polycrystalline film 12 by a solvothermal method, a vacuum vapor deposition method, a radio-frequency sputtering method, a PLD method, a MOCVD method, a MOD method, a sol-gel method, or the like. In this case, a KN solid solution having the same crystal orientation as a BT solid solution is grown on the surfaces of BT solid solution particles, thereby forming a layer having a heterojunction. Also, in this case, the lattice constants of the BT solid solution slightly are different from those of the KN solid solution, and thus a crystal structure gradient region where the lattice constants continuously change, that is, crystal lattice strain, is produced at the interface between both. Therefore, when a crystallographic pseudo-morphotropic phase boundary (MPB) is formed by forming the layer having a heterojunction, a high dielectric constant can be produced.

Next, similarly, the BT solid solution film 14 is grown on the KN solid solution film 13 formed as described above so as to have a heterojunction, thereby forming a pseudo-MPB structure. Consequently, a high dielectric constant can be achieved. Therefore, a very high dielectric constant can be realized by continuously forming many pseudo-MPB structures.

The above-described steps are repeated to form the thin-film dielectric 22 in which the KN solid solution film 13 and the BT solid solution film 14 are alternately stacked on the BT solid solution polycrystalline film 12. The thin-film capacitor element 100 includes a layer composed of the thin-film dielectric 22 and having a thickness of preferably 50 nm or more and 5 μm or less. When the layer composed of the thin-film dielectric 22 has a thickness of less than 50 nm, the capacitance of the thin-film capacitor element 100 is increased, but a leak current is increased. When the layer composed of the thin-film dielectric 22 has a thickness exceeding 5 μm, there is difficulty in forming a uniform layer, and thus cracking easily occurs by firing.

Next, the metal film 15 is formed by a sputtering method or the like on the upper surface of the thin-film dielectric 22 formed as described above, and thus the thin-film capacitor element 100 can be made.

The thin-film capacitor element 100 according to the embodiment may be a capacitor element having a stacked structure as another constitution in which a plurality of composite dielectric layers 21 each including a BT solid solution film 14 and a KN solid solution film 13 are provided on a metal, and further internal electrodes are provided at equal intervals in the composite dielectric layers 21. In such a thin-film capacitor element, the capacitance can be increased.

Although the constitution and making method of the thin-film capacitor element 100 are described above, a mechanism for improving the dielectric constant is described below.

Lead zirconate titanate (PZT) which is known to have high piezoelectric characteristics has a high dielectric constant and piezoelectric constant with a composition near MPB between tetragonal lead titanate ($PbTiO_3$) and rhombohedral lead zirconate ($PbZrO_3$). In the present invention, this structure is used for achieving a high dielectric constant. That is, as described above, a high dielectric constant is achieved by forming many pseudo-MPB structures at interfaces between the BT solid solution and the KN solid solution.

This structure can produce a dielectric constant of 1000 or more, and a dielectric constant of 2000 or more can be obtained by optimizing the structure.

As described above, the thin-film dielectric 22 according to the embodiment can be formed by any one of the various methods. A method for forming a layer having a heterojunction by a solvothermal method, a sputtering method, or a PLD method is described below.

The solvothermal method is a method of performing reaction under high pressure by using an organic solvent as a solvent. By using this method, synthesis can be realized at a low temperature of 300° C. or less, and thus a thin film can be formed while suppressing solid solution.

Figure 2:
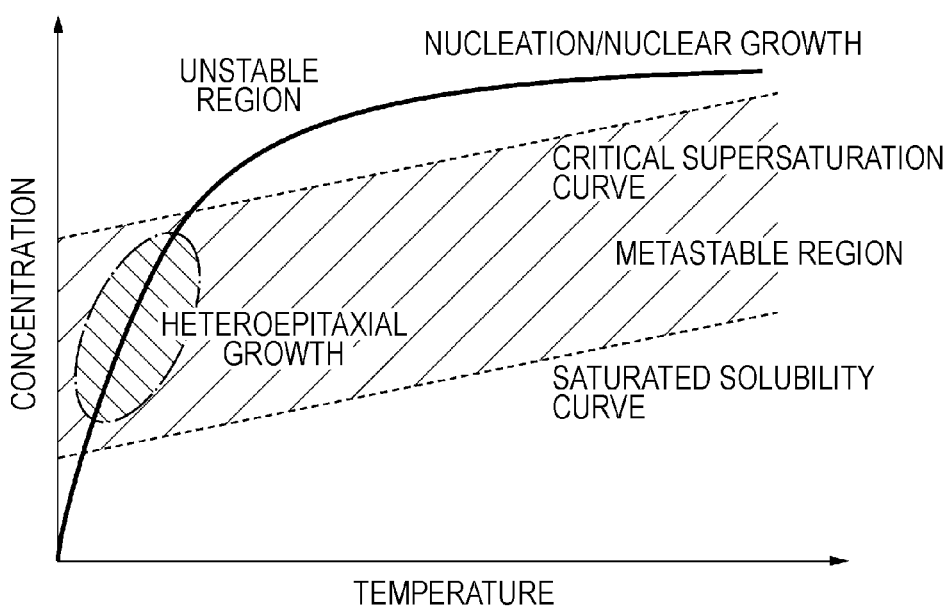
FIG. 2 is a LaMer diagram showing reaction progress according to an embodiment of the present invention.

FIG. 2 is a LaMer diagram relating to solvothermal reaction progress. FIG. 2 shows the temperature as abscissa. Nucleation occurs above a critical supersaturation curve, and in a metastable region, nucleation does not take place, but only nuclear growth takes place. First, conditions for forming the KN solid solution and conditions for the metastable region are examined, and a KN solid solution film having a heterojunction is grown using a BT solid solution as a nucleus to form a composite thin film having an interface (MPB structure) having an artificial heterojunction. Then, conditions for forming a BT solid solution and conditions of the metastable region are examined, and a BT solid solution film having a heterojunction is grown using a KN solid solution as a nucleus to form a composite thin film having an interface (MPB structure) having an artificial heterojunction. This operation is repeated to form a thin-film dielectric having many interfaces (MPB structure) having artificial heterojunctions.

For example, a solvent and predetermined amounts of potassium hydroxide (KOH), potassium carbonate ($K_2CO_3$), niobium pentoxide ($Nb_2O_5$), etc. are placed in a Teflon (registered trade name) vessel, and sufficiently stirred. Then, the metal plate 11 (in this case, a Pt plate) with a surface on which the $BaTiO_3$ polycrystalline film 12 has been formed by a sputtering method is placed in the vessel and subjected to reaction at 170° C. to 250° C. for 2 to 24 hours in an autoclave (solvothermal method). After the reaction, the Pt plate is washed with ethanol and pure water and then dried at 150° C. to 300° C. to form the KN solid solution film 13 on the BT solid solution polycrystalline film 12.

The metal plate 11 on which the BT solid solution polycrystalline film 12 and the KN solid solution film 13 have been formed as described above, a solvent, and predetermined amounts of barium hydroxide ($Ba(OH)_2$), titanium oxide ($TiO_2$), etc. are placed in a Teflon (registered trade name) vessel, sufficiently stirred, and then subjected to reaction at 170° C. to 250° C. for 2 to 24 hours in an autoclave (solvothermal method). After the reaction, the Pt plate is washed with ethanol and pure water and then dried at 150° C. to 300° C. to form the $BaTiO_3$ solid solution-$KNbO_3$ solid solution composite dielectric layer 21.

The repetition of the steps described above can form the $BaTiO_3$—$KNbO_3$ thin-film dielectric 22 having a thickness of 50 nm or more and 5 μm or less. The thin-film dielectric 22 has a high dielectric constant.

The method for forming the $BaTiO_3$ solid solution-$KNbO_3$ solid solution thin-film dielectric 22 by the solvothermal method is described in detail above, but the method is not limited to the solvothermal method as long as the method is a deposition method of growing a layer having a heterojunction at the $BaTiO_3$ solid solution-$KNbO_3$ solid solution interface. The same effect can be obtained even by another deposition method.

The sputtering method is described. The sputtering method is a general film forming method in which a high voltage is applied between a substrate and a target having an intended composition, and raw material particles ejected from the target are caused to collide with the substrate.

For example, the metal plate 11 (in this case, a Ni plate) with a surface on which the BT solid solution polycrystalline film 12 has been formed, and a KN solid solution target having an intended composition are placed in a sputtering apparatus, and the metal plate 11 is heated to 200° C. to 500° C. to form the KN solid solution film 13. In this case, a BT solid solution film formed by using a BT solid solution target may be used instead of the BT solid solution polycrystalline film 12.

The metal plate 11 on which the BT solid solution polycrystalline film 12 and the KN solid solution film 13 have been formed as described above, and a BT solid solution target having an intended composition are placed in the sputtering apparatus, and the metal plate 11 is heated to 200° C. to 500° C. to form a BT solid solution film, thereby forming the $BaTiO_3$ solid solution-$KNbO_3$ solid solution composite dielectric layer 21.

The repetition of the steps described above can form the $BaTiO_3$—$KNbO_3$ thin-film dielectric 22 having a thickness of 50 nm or more and 5 μm or less. The thin-film dielectric 22 has a high dielectric constant. Also, heat treatment may be performed within a range (temperature) in which a layer having a heterojunction is kept formed at the interface between the BT solid solution film and the KN solid solution film.

The PLD method is described. The PLD method is a film forming method in which a target with an intended composition is irradiated with a laser to evaporate a material and deposit the material on a substrate.

For example, the metal plate 11 (in this case, a Ni plate is used) with a surface on which the BT solid solution polycrystalline film 12 has been formed, and a KN solid solution target having an intended composition are placed in a PLD apparatus, and the metal plate 11 is heated to 300° C. to 800° C. to form the KN solid solution film 13. In this case, a BT solid solution film formed by using a BT solid solution target may be used instead of the $BaTiO_3$ polycrystalline film 12.

The metal plate 11 on which the BT solid solution polycrystalline film 12 and the KN solid solution film 13 have been formed as described above, and a BT solid solution target having an intended composition are placed in the PLD apparatus, and the metal plate 11 is heated to 300° C. to 800° C. to form a BT solid solution film, thereby forming the $BaTiO_3$ solid solution-$KNbO_3$ solid solution composite dielectric layer 21.

The repetition of the steps described above can form the $BaTiO_3$—$KNbO_3$ thin-film dielectric 22 having a thickness of 50 nm or more and 5 μm or less. The thin-film dielectric 22 has a high dielectric constant. Also, heat treatment may be performed within a range (temperature) in which a layer having a heterojunction is kept formed at the interface between the BT solid solution film and the KN solid solution film.

The present invention is described in further detail below by giving examples of the present invention, but the present invention is not limited to these examples, and various changes can be made without deviating from the scope of the technical idea of the present invention.

EXAMPLES

Examples 1 to 38

(Formation of $BaTiO_3$ Polycrystalline Film on Metal Plate (in the Examples, Pt Plate))

First, a BT solid solution polycrystalline film 12 of 50 nm was formed under conditions described below on a Pt plate of 10 mm×10 mm having a thickness of 1 mm and a surface flattened by polishing.

The $BaTiO_3$ polycrystalline film 12 of 50 nm was formed by a sputtering method under the conditions including a target of $BaTiO_3$, an atmosphere with an argon (Ar)/oxygen ($O_2$) of 3/1, a pressure of 0.8 Pa, a high-frequency power of 200 W, and a substrate temperature of 200° C.

Then, annealing was performed at 800° C. in order to grow particles of the BT solid solution polycrystalline film 12 deposited on the Pt plate. The annealing temperature was over 600° C. and 1000° C. or less and preferably 800° C. or more and 1000° C. or less. In addition, annealing was performed in an oxidizing atmosphere in order to prevent a lack of oxygen in the BT solid solution polycrystalline film 12. Although, in the examples, the annealing temperature was 800° C., the annealing temperature is generally over 600° C. and 1000° C. or less and preferably 800° C. or more and 1000° C. or less according to the conditions of the film.
(Formation of KN Solid Solution Film on BT Solid Solution Polycrystalline Film)

The BT solid solution polycrystalline film 12 formed on the Pt plate as described above, 20 ml of ethyl alcohol serving as a solvent, and KOH, NaOH, LiOH, Nb$_2$O$_5$, and Ta$_2$O$_5$, which were well dried, were placed in a Teflon (registered trade name) vessel with an inner capacity of 50 ml so as to produce each of the compositions shown in Table 1, and then sufficiently stirred. Then, reaction was performed at 230° C. for 8 hours in an autoclave. After the reaction, the BT solid solution polycrystalline film 12 formed on the Pt plate was washed with ethanol and pure water and then dried at 300° C. to form a BaTiO$_3$—KNbO$_3$ solid solution two-layer film.

(Formation of BT Solid Solution Film on KN Solid Solution Film)

The BaTiO$_3$—KNbO$_3$ solid solution two-layer film formed as described above, 20 ml of water serving as a solvent, and Ba(OH)$_2$, Sr(OH)$_2$, Ca(OH)$_2$, TiO$_2$, ZrO$_2$, and HfO$_2$, which were well dried, were placed in a Teflon (registered trade name) vessel with an inner capacity of 50 ml so as to produce each of the compositions shown in Table 1, and then sufficiently stirred. Then, reaction was performed at 180° C. for 20 hours in an autoclave. After the reaction, the BaTiO$_3$—KNbO$_3$ solid solution film formed on the Pt plate was washed with ethanol and pure water and then dried at 200° C. to form a BaTiO$_3$—KNbO$_3$ solid solution-BaTiO$_3$ solid solution three-layer film.

Further, the KN solid solution film and the BT solid solution film were alternately formed by the method described above to form a multilayered thin-film dielectric film 22 having a total of 10 layers (excluding the BaTiO$_3$ polycrystalline film) and a thickness of 1 μm.

(Formation of Upper Electrode for Evaluation)

A Pt metal film 15 serving as an upper electrode of 5 mm×5 mm was formed by a sputtering method under general conditions on the thin-film dielectric film 22 formed as described above, thereby forming a thin-film capacitor element 100.

(Measurement and Calculation of Dielectric Constant)

The capacitance of the thus-formed thin-film capacitor element 100 was measured by using an impedance analyzer (4294A) manufactured by Agilent Technologies Co., Ltd. at room temperature (25° C.) and a measurement frequency of 100 kHz. The dielectric constant was calculated from the measured capacitance, and the electrode dimensions and the distance of electrodes of the thin-film capacitor element 100.

(Confirmation of Composition of Dielectric Film)

The composition of the thin-film dielectric film 22 was measured for all samples by using X-ray fluorescence analysis (XRF). As a result, the composition was confirmed as shown in Table 1.

TABLE 1

| | Deposition method | BT solid solution film composition (13) $(Ba_{1-x}M_x)_\alpha(Ti_{1-y}N_y)O_3$ | | | | | KN solid solution film composition (14) $(K_{1-w}A_w)_\beta(Nb_{1-z}Ta_z)O_3$ | | | | Dielectric constant |
|---|---|---|---|---|---|---|---|---|---|---|---|
| | | M | $x$ | $\alpha$ | N | $y$ | A | $w$ | $\beta$ | $z$ | |
| Example 1 | Solvothermal | — | 0.00 | 0.91 | — | 0.00 | — | 0.00 | 0.90 | 0.00 | 1579 |
| Example 2 | Solvothermal | Sr | 0.20 | 0.90 | — | 0.00 | — | 0.00 | 0.91 | 0.00 | 1551 |
| Example 3 | Solvothermal | Ca | 0.20 | 0.90 | — | 0.00 | — | 0.00 | 0.90 | 0.00 | 1446 |
| Example 4 | Solvothermal | Sr/Ca | 0.20/0.20 | 0.92 | — | 0.00 | — | 0.00 | 0.92 | 0.00 | 1393 |
| Example 5 | Solvothermal | Sr | 0.40 | 0.91 | — | 0.00 | — | 0.00 | 0.90 | 0.00 | 1482 |
| Example 6 | Solvothermal | — | 0.00 | 0.91 | Zr | 0.20 | — | 0.00 | 0.90 | 0.00 | 1426 |
| Example 7 | Solvothermal | — | 0.00 | 0.90 | Hf | 0.20 | — | 0.00 | 0.91 | 0.00 | 1419 |
| Example 8 | Solvothermal | — | 0.00 | 0.91 | Zr/Hf | 0.20/0.20 | — | 0.00 | 0.92 | 0.00 | 1314 |
| Example 9 | Solvothermal | — | 0.00 | 0.91 | Zr | 0.60 | — | 0.00 | 0.90 | 0.00 | 1510 |
| Example 10 | Solvothermal | Sr | 0.20 | 0.92 | Zr | 0.30 | — | 0.00 | 0.92 | 0.00 | 1319 |
| Example 11 | Solvothermal | Sr | 0.20 | 0.92 | Zr | 0.60 | — | 0.00 | 0.90 | 0.00 | 1078 |
| Example 12 | Solvothermal | Sr | 0.40 | 0.91 | Zr | 0.30 | — | 0.00 | 0.90 | 0.00 | 1265 |
| Example 13 | Solvothermal | Sr | 0.40 | 0.92 | Zr | 0.60 | — | 0.00 | 0.91 | 0.00 | 1044 |
| Example 14 | Solvothermal | Sr/Ca | 0.10/0.10 | 0.90 | Zr/Hf | 0.15/0.15 | — | 0.00 | 0.92 | 0.00 | 1236 |
| Example 15 | Solvothermal | Sr/Ca | 0.20/0.20 | 0.91 | Zr/Hf | 0.30/0.30 | — | 0.00 | 0.90 | 0.00 | 1069 |
| Example 16 | Solvothermal | — | 0.00 | 0.70 | — | 0.00 | — | 0.00 | 0.91 | 0.00 | 1023 |
| Example 17 | Solvothermal | — | 0.00 | 1.00 | — | 0.00 | — | 0.00 | 0.90 | 0.00 | 1567 |
| Example 18 | Solvothermal | — | 0.00 | 0.92 | — | 0.00 | Na | 0.20 | 0.90 | 0.00 | 1463 |
| Example 19 | Solvothermal | — | 0.00 | 0.92 | — | 0.00 | Li | 0.20 | 0.90 | 0.00 | 1262 |
| Example 20 | Solvothermal | — | 0.00 | 0.91 | — | 0.00 | Na/Li | 0.30/0.30 | 0.91 | 0.00 | 1101 |
| Example 21 | Solvothermal | — | 0.00 | 0.92 | — | 0.00 | Na | 0.60 | 0.90 | 0.00 | 1505 |
| Example 22 | Solvothermal | — | 0.00 | 0.90 | — | 0.00 | — | 0.00 | 0.90 | 0.10 | 1584 |
| Example 23 | Solvothermal | — | 0.00 | 0.91 | — | 0.00 | — | 0.00 | 0.92 | 0.20 | 1631 |
| Example 24 | Solvothermal | — | 0.00 | 0.91 | — | 0.00 | Na | 0.20 | 0.91 | 0.10 | 1467 |
| Example 25 | Solvothermal | — | 0.00 | 0.92 | — | 0.00 | Na | 0.20 | 0.91 | 0.20 | 1475 |
| Example 26 | Solvothermal | — | 0.00 | 0.90 | — | 0.00 | Na | 0.60 | 0.90 | 0.10 | 1522 |
| Example 27 | Solvothermal | — | 0.00 | 0.90 | — | 0.00 | Na | 0.60 | 0.92 | 0.20 | 1529 |
| Example 28 | Solvothermal | — | 0.00 | 0.91 | — | 0.00 | Na/Li | 0.15/0.15 | 0.90 | 0.10 | 1326 |
| Example 29 | Solvothermal | — | 0.00 | 0.90 | — | 0.00 | Na/Li | 0.30/0.30 | 0.90 | 0.20 | 1043 |
| Example 30 | Solvothermal | — | 0.00 | 0.93 | — | 0.00 | — | 0.00 | 0.70 | 0.00 | 1119 |
| Example 31 | Solvothermal | — | 0.00 | 0.90 | — | 0.00 | — | 0.00 | 1.00 | 0.00 | 1428 |
| Example 32 | Solvothermal | Sr | 0.20 | 0.90 | Zr | 0.30 | Na | 0.30 | 0.91 | 0.10 | 1427 |
| Example 33 | Solvothermal | Sr | 0.40 | 0.90 | Zr | 0.60 | Na | 0.60 | 0.91 | 0.20 | 1026 |
| Example 34 | Solvothermal | Sr/Ca | 0.20/0.20 | 0.92 | Zr/Hf | 0.30/0.30 | Na | 0.30 | 0.91 | 0.10 | 1233 |
| Example 35 | Solvothermal | Sr/Ca | 0.20/0.20 | 0.91 | Zr/Hf | 0.30/0.30 | Na | 0.60 | 0.91 | 0.20 | 1011 |
| Example 36 | Solvothermal | Sr | 0.20 | 0.91 | Zr | 0.30 | Na/Li | 0.30/0.30 | 0.90 | 0.10 | 1029 |
| Example 37 | Solvothermal | Sr | 0.40 | 0.90 | Zr | 0.60 | Na/Li | 0.30/0.30 | 0.91 | 0.20 | 1014 |
| Example 38 | Solvothermal | Sr/Ca | 0.20/0.20 | 0.93 | Zr/Hf | 0.30/0.30 | Na/Li | 0.30/0.30 | 0.91 | 0.20 | 1009 |
| Example 39 | Sputtering | — | 0.0 | 0.91 | — | 0.0 | — | 0.00 | 0.90 | 0.00 | 1596 |
| Example 40 | Sputtering | Sr/Ca | 0.20/0.20 | 0.92 | — | 0.0 | — | 0.00 | 0.92 | 0.00 | 1408 |
| Example 41 | Sputtering | — | 0.0 | 0.91 | Zr/Hf | 0.20/0.20 | — | 0.00 | 0.92 | 0.00 | 1331 |
| Example 42 | Sputtering | Sr/Ca | 0.10/0.10 | 0.90 | Zr/Hf | 0.15/0.15 | — | 0.00 | 0.92 | 0.00 | 1250 |
| Example 43 | Sputtering | — | 0.0 | 1.00 | — | 0.0 | — | 0.00 | 0.90 | 0.00 | 1579 |

TABLE 1-continued

| | Deposition method | BT solid solution film composition (13) $(Ba_{1-x}M_x)_\alpha(Ti_{1-y}N_y)O_3$ | | | | | KN solid solution film composition (14) $(K_{1-w}A_w)_\beta(Nb_{1-z}Ta_z)O_3$ | | | | Dielectric constant |
|---|---|---|---|---|---|---|---|---|---|---|---|
| | | M | x | α | N | y | A | w | β | z | |
| Example 44 | Sputtering | — | 0.0 | 0.91 | — | 0.0 | Na/Li | 0.30/0.30 | 0.91 | 0.00 | 1116 |
| Example 45 | Sputtering | — | 0.0 | 0.90 | — | 0.0 | — | 0.00 | 0.90 | 0.10 | 1599 |
| Example 46 | Sputtering | — | 0.0 | 0.91 | — | 0.0 | Na/Li | 0.15/0.15 | 0.90 | 0.10 | 1341 |
| Example 47 | Sputtering | — | 0.0 | 0.90 | — | 0.0 | — | 0.00 | 1.00 | 0.00 | 1442 |
| Example 48 | Sputtering | Sr/Ca | 0.20/0.20 | 0.93 | Zr/Hf | 0.30/0.30 | Na/Li | 0.30/0.30 | 0.91 | 0.20 | 1018 |
| Example 49 | PLD | — | 0.0 | 0.91 | — | 0.0 | — | 0.00 | 0.90 | 0.00 | 1575 |
| Example 50 | PLD | Sr/Ca | 0.20/0.20 | 0.92 | — | 0.0 | — | 0.00 | 0.92 | 0.00 | 1389 |
| Example 51 | PLD | — | 0.0 | 0.91 | Zr/Hf | 0.20/0.20 | — | 0.00 | 0.92 | 0.00 | 1312 |
| Example 52 | PLD | Sr/Ca | 0.10/0.10 | 0.90 | Zr/Hf | 0.15/0.15 | — | 0.00 | 0.92 | 0.00 | 1227 |
| Example 53 | PLD | — | 0.0 | 1.00 | — | 0.0 | — | 0.00 | 0.90 | 0.00 | 1576 |
| Example 54 | PLD | — | 0.0 | 0.91 | — | 0.0 | Na/Li | 0.30/0.30 | 0.91 | 0.00 | 1092 |
| Example 55 | PLD | — | 0.0 | 0.90 | — | 0.0 | — | 0.00 | 0.90 | 0.10 | 1580 |
| Example 56 | PLD | — | 0.0 | 0.91 | — | 0.0 | Na/Li | 0.15/0.15 | 0.90 | 0.10 | 1323 |
| Example 57 | PLD | — | 0.0 | 0.90 | — | 0.0 | — | 0.00 | 1.00 | 0.00 | 1419 |
| Example 58 | PLD | Sr/Ca | 0.20/0.20 | 0.93 | Zr/Hf | 0.30/0.30 | Na/Li | 0.30/0.30 | 0.91 | 0.20 | 1003 |
| Comparative Example 1 | Solvothermal | — | 0.00 | 0.97 | — | 0.00 | — | — | — | — | 523 |
| Comparative Example 2 | Solvothermal | — | — | — | — | — | — | 0.00 | 0.94 | 0.00 | 411 |
| Comparative Example 3 | Solvothermal | Sr | 0.50 | 0.93 | — | 0.00 | — | 0.00 | 0.91 | 0.00 | 834 |
| Comparative Example 4 | Solvothermal | — | 0.00 | 0.90 | Zr | 0.90 | — | 0.00 | 0.91 | 0.00 | 622 |
| Comparative Example 5 | Solvothermal | Sr | 0.20 | 0.92 | Zr | 0.90 | — | 0.00 | 0.93 | 0.00 | 583 |
| Comparative Example 6 | Solvothermal | Sr | 0.40 | 0.90 | Zr | 0.90 | — | 0.00 | 0.91 | 0.00 | 567 |
| Comparative Example 7 | Solvothermal | Sr | 0.50 | 0.93 | Zr | 0.30 | — | 0.00 | 0.90 | 0.00 | 670 |
| Comparative Example 8 | Solvothermal | Sr | 0.50 | 0.91 | Zr | 0.60 | — | 0.00 | 0.90 | 0.00 | 571 |
| Comparative Example 9 | Solvothermal | Sr | 0.50 | 0.90 | Zr | 0.90 | — | 0.00 | 0.90 | 0.00 | 442 |
| Comparative Example 10 | Solvothermal | — | 0.00 | 0.53 | — | 0.00 | — | 0.00 | 0.92 | 0.00 | 765 |
| Comparative Example 11 | Solvothermal | — | 0.00 | 1.18 | — | 0.00 | — | 0.00 | 0.90 | 0.00 | 907 |
| Comparative Example 12 | Solvothermal | — | 0.00 | 0.92 | — | 0.00 | Na | 0.90 | 0.91 | 0.00 | 517 |
| Comparative Example 13 | Solvothermal | — | 0.00 | 0.90 | — | 0.00 | — | 0.00 | 0.90 | 0.30 | 904 |
| Comparative Example 14 | Solvothermal | — | 0.00 | 0.93 | — | 0.00 | Na | 0.20 | 0.91 | 0.30 | 883 |
| Comparative Example 15 | Solvothermal | — | 0.00 | 0.90 | — | 0.00 | Na | 0.60 | 0.91 | 0.30 | 998 |
| Comparative Example 16 | Solvothermal | — | 0.00 | 0.93 | — | 0.00 | Na | 0.90 | 0.91 | 0.10 | 630 |
| Comparative Example 17 | Solvothermal | — | 0.00 | 0.91 | — | 0.00 | Na | 0.90 | 0.90 | 0.20 | 681 |
| Comparative Example 18 | Solvothermal | — | 0.00 | 0.90 | — | 0.00 | Na | 0.90 | 0.92 | 0.30 | 602 |
| Comparative Example 19 | Solvothermal | — | 0.00 | 0.93 | — | 0.00 | — | 0.00 | 0.49 | 0.00 | 775 |
| Comparative Example 20 | Solvothermal | — | 0.00 | 0.92 | — | 0.00 | — | 0.00 | 1.17 | 0.00 | — |
| Comparative Example 21 | PLD | — | 0.00 | 0.99 | — | 0.00 | — | 0.00 | 0.99 | 0.00 | 492 |

As shown in Table 1, it can be confirmed that the $BaTiO_3$—$KNbO_3$ thin-film capacitor element of Example 1 shows a high dielectric constant of 1579. Similarly, it can be confirmed that a high dielectric constant exceeding 1300 is exhibited even by a thin film in which 40 mol % or less of Ba is substituted by Sr or Ca as shown in Examples 2 to 5, and a thin film in which 60 mol % or less of Ti is substituted by Zr or Hf as shown in Examples 6 to 9.

Similarly, it can be confirmed that a high dielectric constant exceeding 1000 is exhibited even by a thin film in which 40 mol % or less and 60 mol % or less of Ba and Ti, respectively, are simultaneously substituted as shown in Examples 10 to 15.

Also, it can be confirmed that as shown in Examples 16 and 17, even when the Ba/Ti ratio (A/B ratio) α of the $BaTiO_3$ solid solution is changed within the range of 0.7 to 1.0, a dielectric constant exceeding 1000 is exhibited.

On the other hand, it can be confirmed that as shown in Examples 18 to 29, a dielectric constant exceeding 1000 is exhibited even by a thin film in which 60 mol % or less of K of $KNbO_3$ is substituted by Na or Li and a thin film in which 20 mol % or less of Nb of $KNbO_3$ is substituted by Ta.

Further, it can be confirmed that as shown in Examples 30 and 31, even when the K/Nb ratio (A/B ratio) β of the KNbO$_3$ solid solution is changed within the range of 0.7 to 1.0, a dielectric constant exceeding 1100 is exhibited.

Also, it can be confirmed that as in the case where the elements of each of the BaTiO$_3$ solid solution and the KNbO$_3$ solid solution are individually substituted, even when the elements are simultaneously substituted as shown in Examples 32 to 38, a high dielectric constant exceeding 1000 is exhibited.

In the thin-film capacitor element 100 made in each of Examples 1 to 38, the thin-film dielectric film 22 was processed into a thin film by using a focused ion beam (FIB), and a microstructure was confirmed at an acceleration voltage of 200 kV by using TEM manufactured by Hitachi High Technologies Corporation. At the same time, a lattice image of the BaTiO$_3$—KNbO$_3$ interface was observed. As a result, it could be confirmed that a layer having a heterojunction is formed.

Examples 39 to 48

As in Examples 1 to 38, a BT solid solution polycrystalline film 12 of 50 nm was formed on a metal plate 11 (in the examples, a Ni plate) of 10 mm×10 mm having a thickness of 1 mm and a surface flattened by polishing, followed by annealing at 800° C.

The BT solid solution polycrystalline film 12 formed on the Ni plate as described above and a KN solid solution target having a composition shown in Table 1 were placed, and a KN solid solution film 13 having a thickness of 50 nm was formed by a sputtering method under the conditions including an atmosphere with an argon (Ar)/oxygen (O$_2$) of 3/1, a pressure of 0.8 Pa, a high-frequency power 200 W, and a substrate temperature of 200° C., thereby forming a BaTiO$_3$—KNbO$_3$ solid solution two-layer film.

The BaTiO$_3$—KNbO$_3$ solid solution two-layer film formed as described above and a BT solid solution target having a composition shown in Table 1 were placed, and a KN solid solution film 14 having a thickness of 50 nm was formed by a sputtering method under the conditions including an atmosphere with an argon (Ar)/oxygen (O$_2$) of 3/1, a pressure of 0.8 Pa, a radio-frequency power 200 W, and a substrate temperature of 200° C., thereby forming a BaTiO$_3$—KNbO$_3$ solid solution-BaTiO$_3$ solid solution three-layer film.

Further, the KN solid solution film and the BT solid solution film were alternately formed by a sputtering method according to the above-described method to form a multilayered thin-film dielectric film 22 having a total of 10 layers (excluding the BT solid solution polycrystalline film) and a thickness of 1 μm.

A Pt metal film 15 was formed by the same method as in Examples 1 to 38 on the thin-film dielectric film 22 formed as described above, and the dielectric constant was measured and calculated. Also, the composition of the thin-film dielectric film 22 was confirmed as shown in Table 1 by XRF analysis.

As shown in Table 1, it can be confirmed that like in the thin-film capacitor element made by the solvothermal method, the BaTiO$_3$—KNbO$_3$ thin-film capacitor element of Example 39 exhibits a high dielectric constant of 1596. Similarly, it can be confirmed that like in the thin-film capacitor element made by the solvothermal method, a high dielectric constant exceeding 1000 is exhibited even by a thin film in which Ba is partially substituted by Sr or Ca, and a thin film in which Ti is partially substituted by Zr or Hf, and even when the Ba/Ti ratio (A/B ratio) α of the BaTiO$_3$ solid solution and the K/Nb ratio (A/B ratio) β of the KNbO$_3$ solid solution are changed.

Like in the thin-film dielectric film 22 formed in each of Examples 1 to 38, the thin-film dielectric film 22 was processed into a thin film by FIB, and a lattice image of the BaTiO$_3$—KNbO$_3$ interface was observed with TEM. As a result, it could be confirmed that a layer having a heterojunction is formed.

Examples 49 to 58

Like in Examples 39 to 48, a BT solid solution polycrystalline film 12 of 50 nm was formed on a metal plate 11 (in the examples, a Ni plate) of 10 mm×10 mm having a thickness of 1 mm and a surface flattened by polishing, followed by annealing at 800° C.

The BT solid solution polycrystalline film 12 formed on the Ni plate as described above and a KN solid solution target having a composition shown in Table 1 were placed, and a KN solid solution film 13 having a thickness of 50 nm was formed by a PLD method under the conditions including a substrate temperature of 600° C., a laser power of 50 mJ, an O$_2$ atmosphere as introduced gas, and a pressure of 33×10$^{-3}$ Pa, thereby forming a BaTiO$_3$—KNbO$_3$ solid solution two-layer film.

The BaTiO$_3$—KNbO$_3$ solid solution two-layer film formed as described above and a BT solid solution target having a composition shown in Table 1 were placed, and a BT solid solution film 14 having a thickness of 50 nm was formed by a PLD method under the conditions including a substrate temperature of 600° C., a laser power of 50 mJ, an O$_2$ atmosphere as introduced gas, and a pressure of 33×10$^{-3}$ Pa, thereby forming a BaTiO$_3$—KNbO$_3$ solid solution-BaTiO$_3$ solid solution three-layer film.

Further, the KN solid solution film and the BT solid solution film were alternately formed by the above-described method to form a multilayered thin-film dielectric film 22 having a total of 10 layers (excluding the BT solid solution polycrystalline film) and a thickness of 1 μm.

A Pt metal film 15 was formed by the same method as in Examples 1 to 48 on the thin-film dielectric film 22 formed as described above, and the dielectric constant was measured and calculated. Also, the composition of the thin-film dielectric film 22 was confirmed as shown in Table 1 by XRF analysis and.

As shown in Table 1, it can be confirmed that like in the thin-film capacitor element made by the solvothermal method and the thin-film capacitor element made by the sputtering method, the BaTiO$_3$—KNbO$_3$ thin-film capacitor element of Example 49 exhibits a high dielectric constant of 1575. Similarly, it can be confirmed that like in the thin-film capacitor element made by the solvothermal method, a high dielectric constant exceeding 1000 is exhibited even by a thin film in which Ba is partially substituted by Sr or Ca, and a thin film in which Ti is partially substituted by Zr or Hf, and even when the Ba/Ti ratio (A/B ratio) α of the BaTiO$_3$ solid solution and the K/Nb ratio (A/B ratio) β of the KNbO$_3$ solid solution are changed as shown in Examples 50 to 58.

Like in the thin-film dielectric film 22 formed in each of Examples 1 to 48, the thin-film dielectric film 22 was processed into a thin film shape by FIB, and a lattice image of the BaTiO$_3$—KNbO$_3$ interface was observed with TEM. As a result, it could be confirmed that a layer having a heterojunction is formed.

Comparative Example 1

A BT solid solution polycrystalline film 12 was formed on a metal plate 11 (in this example, a Pt plate) of 10 mm×10 mm having a thickness of 1 mm by the same method as in Examples 1 to 38. However, in Comparative Example 1, the thickness of the BaTiO$_3$ polycrystalline film 12 was the same as in the examples. Then, as in the examples, a Pt metal film 15 serving as an upper electrode was formed by annealing, and the dielectric constant was measured.

As a result, when only the BaTiO$_3$ polycrystalline film is present without a BaTiO$_3$—KNbO$_3$ interface, as shown in Table 1, the dielectric constant is 523 which is a lower value than in the examples.

Comparative Example 2

As in Comparative Example 1, a KNbO$_3$ polycrystalline film having a thickness of 50 nm was formed, a Pt metal film 15 serving as an upper electrode was formed by annealing, and the dielectric constant was measured.

As a result, when only the KNbO$_3$ polycrystalline film is present without a KNbO$_3$—BaTiO$_3$ interface, as shown in Table 1, the dielectric constant is 411 which is a lower value than in the examples.

Comparative Examples 3 to 20

A thin-film dielectric 22 was formed on a metal plate 11 (in this case, a Pt plate) of 10 mm×10 mm having a thickness of 1 mm by the same method as in Examples 1 to 38 so as to produce each of the composition ratios shown in Table 1. Then, a Pt metal film 15 serving as an upper electrode for evaluation was formed, and the dielectric constant was measured.

As a result, as shown in Table 1, the dielectric constant is decreased to 1000 or less by substituting 50 mol % of Ba of BaTiO$_3$ with Sr or Ca and substituting 90 mol % of Ti with Zr or Hf. Similarly, even when the Ba/Ti ratio (A/B ratio) α of the BaTiO$_3$ solid solution is 0.53 or 1.18, the dielectric constant is decreased to 1000 or less.

Also, the dielectric constant is decreased to 1000 or less by substituting 90 mol % of K of KNbO$_3$ with Na or Li and substituting 30 mol % of Nb with Ta. Similarly, even when the K/Nb ratio (A/B ratio) β of the KNbO$_3$ solid solution is 0.49, the dielectric constant is decreased to 1000 or less. However, when β was 1.17, the thin-film dielectric 22 showed deliquescence and thus electric characteristics could not be evaluated.

Comparative Example 21

A BT solid solution polycrystalline film 12 was formed on a metal plate 11 (in this example, a Pt plate) of 10 mm×10 mm having a thickness of 1 mm by the same method as in Examples 49 to 58. Then, a KNbO$_3$ film having a thickness of 100 nm was formed by a PLD method using KNbO$_3$ as a target under conditions described below.

The substrate temperature was room temperature, the laser power was 50 mJ, the introduced gas was an O$_2$ atmosphere, and the pressure was 1.33×10$^{-3}$ Pa.

Also, after the KNbO$_3$ film was formed, a BaTiO$_3$ film of 100 nm was formed by using BaTiO$_3$ as a target under the same conditions as for the KNbO$_3$ film. Further, the KNbO$_3$ film and the BaTiO$_3$ film were alternately formed to form a film having a total thickness of 1 μm.

After film deposition, heat treatment was performed in an oxygen atmosphere at 800° C. for 1 minute, a Pt metal film 15 serving as an upper electrode was formed, and the dielectric constant was measured. At the same time, it was confirmed by TEM that a layer having a heterojunction is absent at each of the interfaces. As a result, when a layer having a BaTiO$_3$—KNbO$_3$ heterojunction is absent, as shown in Table 1, the dielectric constant is 492 which is a lower value than the layers having a heterojunction in the examples.

The examples and the comparative examples indicate that in comparison with the BaTiO$_3$ solid solution polycrystalline film and the KNbO$_3$ solid solution polycrystalline film, a multilayered structure in which a BaTiO$_3$—KNbO$_3$ interface is controlled can form a crystal structure gradient region where the lattice constant continuously changes at the interface, and thus crystal lattice strain occurs, thereby permitting large improvement in the dielectric constant.

The thin-film dielectric and the thin-film capacitor element according to the present invention can be used for integrated circuits with active elements such as a transistors and the like.

What is claimed is:

1. A thin-film dielectric comprising:
two or more layers, each layer containing a $(Ba_{1-x}M_x)_\alpha(Ti_{1-y}N_y)O_3$ film (M is at least one of Sr and Ca, N is at least one of Zr and Hf, $0 \leq x \leq 0.4$, $0 \leq y \leq 0.6$, and $0.7 \leq \alpha \leq 1.0$) and a $(K_{1-w}A_w)_\beta(Nb_{1-z}Ta_z)O_3$ film (A is at least one of Na and Li, $0 \leq w \leq 0.6$, $0 \leq z \leq 0.2$, and $0.7 \leq \beta \leq 1.0$), the $(Ba_{1-x}M_x)_\alpha(Ti_{1-y}N_y)O_3$ film and the $(K_{1-w}A_w)_\beta(Nb_{1-z}Ta_z)O_3$ film being joined to each other, the $(Ba_{1-x}M_x)_\alpha(Ti_{1-y}N_y)O_3$ films and the $(K_{1-w}A_w)_\beta(Nb_{1-z}Ta_z)O_3$ films being alternately formed,
wherein for each of said two or more layers, the $(Ba_{1-x}M_x)_\alpha(Ti_{1-y}N_y)O_3$ film and the $(K_{1-w}A_w)_\beta(Nb_{1-z}Ta_z)O_3$ film have an interface between them that has a crystal structure gradient region where a lattice constant continuously changes due to lattice mismatching.

2. The thin-film dielectric according to claim 1 wherein a layer having a heterojunction between the $(Ba_{1-x}M_x)_\alpha(Ti_{1-y}N_y)O_3$ film and the $(K_{1-w}A_w)_\beta(Nb_{1-z}Ta_z)O_3$ film is formed for each of said two or more layers.

3. A thin-film capacitor element comprising electrodes formed on both surfaces of the thin-film dielectric according to claim 1.

4. A thin-film capacitor element comprising at least one internal electrode layer formed in the thin-film dielectric according to claim 1.

* * * * *